United States Patent
Forrest et al.

(10) Patent No.: US 8,440,021 B2
(45) Date of Patent: May 14, 2013

(54) APPARATUS AND METHOD FOR DEPOSITION FOR ORGANIC THIN FILMS

(75) Inventors: Stephen R. Forrest, Ann Arbor, MI (US); Fan Yang, Piscataway, NJ (US); Richard Lunt, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 1031 days.

(21) Appl. No.: 12/467,468

(22) Filed: May 18, 2009

(65) Prior Publication Data
US 2009/0280247 A1 Nov. 12, 2009

Related U.S. Application Data

(63) Continuation-in-part of application No. 12/030,362, filed on Feb. 13, 2008, now abandoned.

(60) Provisional application No. 60/965,117, filed on Aug. 16, 2007.

(51) Int. Cl.
*C23C 16/00* (2006.01)

(52) U.S. Cl.
USPC .......... 118/720; 118/715; 118/724; 118/726; 427/255.23; 427/255.27; 427/255.28

(58) Field of Classification Search ................. None
See application file for complete search history.

(56) References Cited

U.S. PATENT DOCUMENTS

| 6,337,102 B1 | 1/2002 | Forrest |
| 6,374,902 B1 * | 4/2002 | Vendeville et al. ........... 164/453 |

OTHER PUBLICATIONS

Shtein, M. et al., Material transport regimes and mechanisms for growth of molecular organic thin films using low-pressure organic vapor phase deposition, 2001, Jounal of Applied Physics, vol. 89(2), pp. 1470-1476.*

* cited by examiner

*Primary Examiner* — Robert Xu
(74) *Attorney, Agent, or Firm* — Kenyon & Kenyon LLP

(57) ABSTRACT

The invention provides apparatus and methods for organic continuum vapor deposition of organic materials on large area substrates.

15 Claims, 17 Drawing Sheets

APPARATUS AND METHOD FOR DEPOSITION FOR ORGANIC THIN FILMS

CROSS-REFERENCE TO RELATED APPLICATIONS

The present application is a continuation-in-part of U.S. application Ser. No. 12/030,362 filed on Feb. 13, 2008 now abandoned, which claims the benefit of U.S. Provisional Application No. 60/965,117, filed on Aug. 16, 2007, each of which is expressly incorporated herein in its entirety by reference thereto.

GOVERNMENT RIGHTS

This invention was made with Government support under Contract No. FA9550-07-1-0364 awarded by the Air Force Office of Scientific Research. The government has certain rights in this invention.

FIELD OF THE INVENTION

The present invention relates to apparatus and methods for the deposition of organic films. In particular, the invention relates to apparatus and methods for the deposition of substantially uniform thin films on large-area substrates, where the films may be neat or a mixture of organic materials, such as a host/dopant mixture.

RESEARCH AGREEMENTS

The claimed invention was made by, on behalf of, and/or in connection with one or more of the following parties to a joint university corporation research agreement: Princeton University, The University of Southern California, The University of Michigan, and Universal Display Corporation. The agreement was in effect on and before the date the claimed invention was made, and the claimed invention was made as a result of activities undertaken within the scope of the agreement.

BACKGROUND

Vacuum and low pressure thermal evaporation techniques have been used to deposit thin films of organic materials for a variety of organic electronics, such as photovoltaics, organic light emitting devices (OLEDs), and thin film transistors, on research scales and, to a limited extent, on industrial scales. Prior art techniques are prone to poor material usage, and cannot be scaled easily for large sized substrates. Substantially uniform deposition of organic thin films on large area substrates requires large, expensive deposition systems that require increased source material and cleaning.

SUMMARY

The present invention is directed to apparatus and methods for organic continuum vapor deposition (OCVD) and a source cell for vapor deposition. The organic continuum vapor deposition apparatus of the invention includes a heated chamber, where all walls of the chamber are heated, a cooled substrate within the chamber, having a coating surface, at least one source cell, having an output opening directed into the heated chamber, at least one organic material source, at least one heater, providing sufficient heat to convert the organic material into an organic vapor, and at least one carrier gas source. The heated chamber has a temperature sufficiently high to provide diffusive mixing of the gas and vapor from the source cell to provide a uniform organic flux of the organic vapor, above the cooled substrate, thereby depositing a substantially uniform film of the organic material on coating surface of the cooled substrate. The diffusive mixing provides the uniform flux in a relatively short distance from the outlet of the source cell. Preferably, the source cell has an output directed at the substrate surface. Preferably, the source cell is positioned in a heated back or end plate of the chamber. More preferably, the source cell is positioned in a heated back or end plate of the chamber, and has an output directed at the substrate surface. Most preferably, the source cell is centered in a heated back or end plate of the chamber, and has an output directed at the center of the substrate surface.

The method of the invention includes heating an organic material, forming an organic vapor, transporting the organic vapor in a carrier gas from a source cell into a heated chamber, wherein all walls of the chamber are heated, heating the chamber sufficiently to form a substantially uniform organic flux of the carrier gas and organic vapor by diffusive mixing of the gas and vapor within the heated chamber, directing the uniform organic flux to a cooled substrate, and depositing the organic material onto a surface of the cooled substrate, thereby forming an organic film on the substrate. Preferably, the method may further include directing a source cell output at the substrate surface. Preferably, the method may further include positioning the source cell in a heated back or end plate of the chamber. More preferably, the method may further include positioning the source cell in a heated back or end plate of the chamber, and directing the at the substrate surface. Most preferably, the source cell is centered in a heated back or end plate of the chamber, and has an output directed at the center of the substrate surface The source cell of the invention includes a hollow barrel, having a gas input and a gas output, and a stopper at a first end of an actuator rod. The stopper and actuating rod have a first, closed position within the barrel, thereby preventing gas flow through the gas output, and a second, open position, allowing gas to flow from the gas output. The stopper has a cross-sectional shape sufficiently similar to the gas outlet shape to seal the gas outlet when the stopper is in the first, closed position.

DETAILED DESCRIPTION

Figure 1:
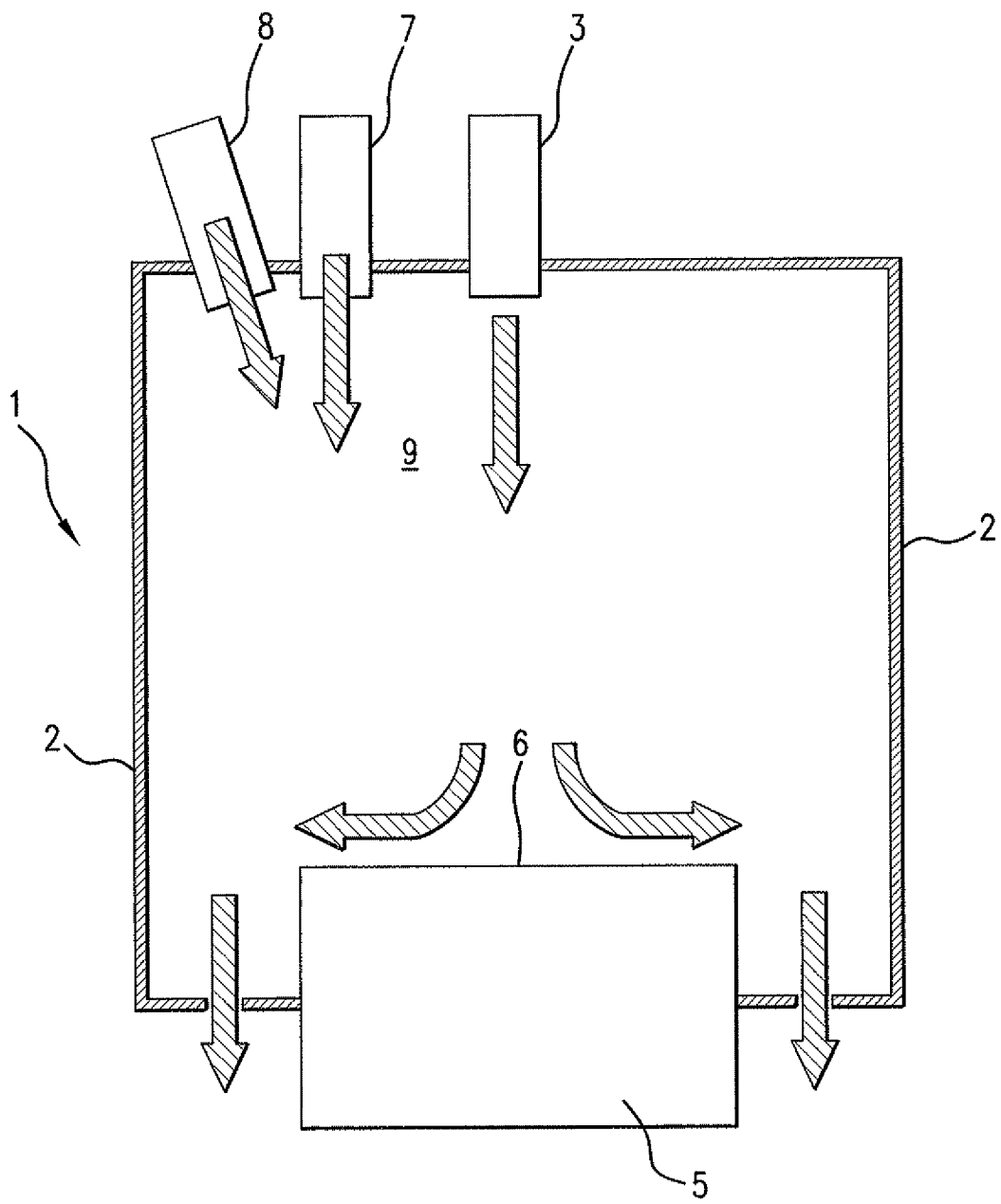
FIG. 1 illustrates an organic continuum vapor deposition (OVCD) chamber of the invention.

As used herein, the term "diffusive mixing" refers to mixing that is the result of diffusion alone in contrast to, e.g., turbulent mixing. Diffusive mixing requires no artificial mixing, such as that provided by, e.g., a showerhead, propeller, or other turbulent mixing source.

As used herein, a "substantially uniform organic flux" refers to a mixture of organic vapor and carrier gas in which the concentration of the organic vapor does not vary by more than about 20 mole percent. Preferably, the concentration of the organic vapor does not vary by more than about 15 mole percent, more preferably, the concentration of the organic vapor does not vary by more than about 10 mole percent, and, most preferably, the concentration of the organic vapor does not vary by more than about 5 mole percent. Concentration gradients within the flux are substantially absent. Also as used herein, a "substantially uniform organic film" refers to a film of organic material, deposited on a substrate, where the concentration and thickness of the deposited organic material does not vary by more than about 20 mole percent. Preferably, the concentration and thickness of the deposited organic material does not vary by more than about 15 mole percent, more preferably, the concentration and thickness of the deposited organic material does not vary by more than about 10 mole percent, and, most preferably, the concentration and thickness of the deposited organic material does not vary by more than about 5 mole percent.

The terms "evaporation temperature" and "sublimation temperature" are used interchangeably herein, and refer to the temperature at or above which an organic material produces a vapor of the organic material. As used herein, the term "condensation temperature" refers to the temperature at or below which an organic vapor will condense onto a surface to form a solid film. The condensation temperature is typically about the same as the evaporation or sublimation temperature.

The invention provides apparatus and methods for organic continuum vapor deposition (OCVD) of organic materials on substrates. The invention provides diffusive mixing in a heated deposition chamber to create a uniform organic flux that is directed to and deposited on a cooled substrate to form a substantially uniform film of organic material on the substrate. The apparatus and methods of the invention may be scaled up to provide substantially uniform organic films on substrates significantly larger than previously possible without the use of complex apparatus, such as shower heads. The apparatus and methods of the invention may be used to provide substantially uniform organic films on substrates having a size on the order of substrates coated with prior art deposition apparatus and methods to substrates having at least one dimension greater than three meters. Substantially uniform organic films may be deposited on substrates having at least one dimension of about 0.25 m, 0.5 m, 0.75 m, 1 m, 1.25 m, 1.5 m, 1.75 m, 2 m, 2.25 m, 2.5 m, 2.75 m, and larger with the apparatus and methods of the invention. By heating the entire chamber, including the source or back plate, uniform organic fluxes may be obtained with height or length to width ratios of as low as about 0.75. As used herein, the source or back plate is that wall of the chamber in which one or more source cells are positioned to direct carrier gas and organic vapor into the OCVD chamber and toward the substrate. Heating the source or back plate sufficiently provides a heated source zone in the OCVD chamber where diffusive mixing occurs, establishing the desired uniform organic flux of the organic material to be deposited. The method of the invention may be applied to a continuous process with a row of centrally located source cells or in a batch reactor with one or more source cells.

An OCVD chamber and substrate are illustrated in FIG. 1. The OCVD chamber 10 comprises a chamber 1, having a plurality of heated walls 2, at least one source cell 3, positioned through a heated source or back plate 4, such that the carrier gas and organic vapor are introduced into the chamber 1. The source plate 4 may be, e.g., a ceramic block. A cooled substrate 5, having a surface to be coated 5, is placed within the chamber 1. The arrows in FIG. 1 generally illustrate the path of gases and vapors within the OCVD chamber. The source cell 3 is preferably positioned at approximately the center of the source or back plate, and has an axis that is normal to a point about at the center of the surface 6 of the substrate 5. Additional or alternative source cells 7 and 8 may also be used to introduce organic vapor and carrier gas. The additional or alternative source cells may be placed in any convenient position in the back plate 4, as illustrated by source cell 7, but are preferably angled, such that the flow of gas and vapor are directed from the source cell toward the center of the surface 6, as illustrated by source cell 8. Diffusive mixing of the gas and vapor from the source cells occurs in a source zone 9 in proximity to or adjacent to the source or back plate 4. The simultaneous use of multiple source cells allows for the deposition of doped materials in substantially uniform layers. Preferably, each source cell has an axis through the outlet of the source cell that is directed to at least a portion of the substrate.

In the method of the invention, an organic material is heated in a source cell to a temperature higher than the sublimation temperature of the material to form a vapor. The organic material may be heated to form the vapor by any means known in the art. Preferably, the organic material is heated thermally. The organic vapor is transported from the source cell into a heated OCVD chamber by a carrier gas, preferably, an inert carrier gas, such as nitrogen or helium, in the direction of the surface of a cooled substrate, where the temperature of the surface of the cooled substrate is less than the condensation temperature of the organic vapor. All of the walls, including the source or back plate, of the OCVD chamber are heated to a temperature higher than the condensation temperature of the organic vapor, such that a substantially uniform organic flux of the organic vapor is formed within the chamber by diffusive mixing. The substantially uniform organic flux is directed, preferably, by a pressure differential within the deposition chamber, to the cooled substrate. The organic vapor condenses of the surface of the cooled substrate, forming a substantially uniform organic film.

Preferably, every surface within the deposition chamber, except the cooled substrate, is heated to a temperature at least about 5° C. higher than the condensation temperature of the organic vapor, more preferably, at least about 10° C. higher, and, most preferably, at least about 20° C. higher than the condensation temperature of the organic vapor. Organic materials that may be deposited with OCVD include, but are not limited to, BCP (evaporation/sublimation temperature, $T_{sub}$, of about 160° to about 200° C.), pentacene ($T_{sub}$ of about 260° to about 280° C.), NPD ($T_{sub}$ of about 270° to about 300° C.), Alq$_3$ ($T_{sub}$ of about 270° to about 300° C.), CuPc ($T_{sub}$ of about 400° to about 460° C.), PTCBI ($T_{sub}$ of about 420° to about 480° C.), and C60, ($T_{sub}$ of about 420° to about 480° C.). A partial listing of these and other materials that may be deposited with OCVD is provided below. Adequately heating every surface within the OCVD chamber (other than the cooled substrate) sufficiently reduces or eliminates cold spots in the organic vapor and results in diffusive mixing of the organic vapor in the chamber, establishing the substantially uniform organic flux for deposition on the substrate. It is noted that if, for example, only side walls of the chamber are heated, cold regions occur toward the end walls. Moreover, by heating all of the walls of the chamber, as well as the source cell, the vapor molecules remain continuously exposed to high temperature until reaching the cooled substrate.

Preferably, the surface of the substrate is cooled to a temperature at least about 50° C. lower than the condensation temperature of the organic vapor, more preferably, at least about 100° C. lower, and, most preferably, at least about 150° C. lower than the condensation temperature of the organic vapor. Even lower temperatures may be used, such as 200°, 250°, or 300° C. lower than the condensation temperature. The temperature of the substrate is preferably low enough that the concentration of organic vapor molecules in a small volume directly above the cooled substrate may be approximated as zero for modeling purposes.

The pressure within the source cell and in the chamber may be over any practical range. As will be recognized by one of ordinary skill in the art, the pressure within the source cell will be greater than that within the OCVD chamber. Useful pressures range from above one atmosphere to less than 10 mtorr. Useful pressure ranges include 760 to 100 torr, 100 to 10 torr, and 10 to 0.00001 torr.

The flow rate of the organic vapor in moles per second from a source cell may be expressed by Equation (1), $$r_{out} = \frac{P_{org}^{eq}(T_{cell})}{\frac{\sqrt{2\pi M_{org} R T_{cell}}}{A_{source}} + \frac{RT_{cell}}{Q}}, \quad (1)$$

where $r_{out}$ is the evaporation rate in moles per second, $P_{org}^{eq}$ is the equilibrium vapor pressure of the organic material at temperature $T_{cell}$, the temperature of the source cell, Q is the flow rate of the carrier gas in standard cubic centimeters per minute (sccm), $A_{source}$ is the surface area of the source of organic material, $M_{org}$ is the molar molecular weight of the organic material, and R is the molar gas constant To obtain a similar deposition rate with a larger substrate, the evaporated flux of organic vapor must be increased by a factor proportional to the change in substrate area, which is given by equation (2), $$r_2^{out} = \frac{A_2^{sub}}{A_1^{sub}} r_1^{out}, \quad (2)$$

where $r_1^{out}$ is the evaporation rate required for the first substrate, $r_2^{out}$ is the evaporation rate for the second substrate, $A_1^{sub}$ is the surface area of the first substrate, $A_2^{sub}$ is the area of the second substrate. Equations (1) and (2) were solved numerically to determine the flow rate and/or the growth temperature required for a given substrate size.

For example, coating a substrate having an area of 25 cm$^2$ requires a Q of about 25 sccm, a $T_{cell}$ of about 650 K (377° C.), and a source area, $A_{source}$, of about 0.1 cm$^2$. To scale up the apparatus for a 1.5 m square substrate requires a Q of about 2,000 sccm, a $T_{cell}$ of about 660 K (387° C.), and a source area, $A_{source}$, of about 100 cm$^2$.

Figure 2:
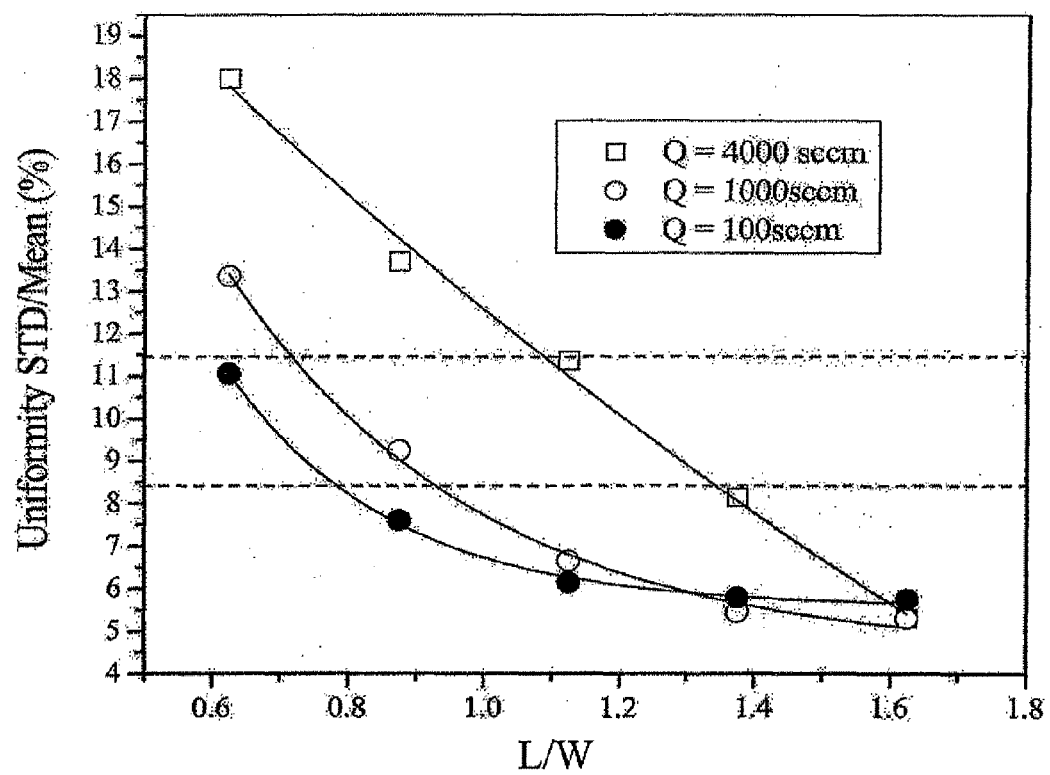
FIG. 2 is a plot of the uniformity of the flux against the length to width ratio of the OCVD chamber.

Modeling shows that the uniformity of the flux, and, thus, the deposited film, varies with the materials deposited, the flow rate, Q, and the length to width ratio, L/W, of the deposition chamber, where the length, L, is the source to the substrate distance, and the width, W, is the width the deposition chamber. Modeling of the apparatus and methods of the invention are described below. Results for the variation in the uniformity of the flux produced as a function of Q and L/W is illustrated in FIG. 2. FIG. 2 provides a plot of the relative deviation of the organic flux against L/W for a fixed W. The modeling parameters used in preparing the graph of FIG. 2 were as follows:

Carrier gas: Nitrogen;
Pressure: 1.33 Pa ($1 \times 10^{-2}$ torr);
Heat capacity: 1000 J/kg-K;
Substrate temperature: 300K (27° C.);
Wall temperature: 650K (377° C.);
Viscosity (300K): $1.73 \times 10^{-5}$ kg/m-s;
Density: P/(RT) kg/m$^3$;
Thermal conductivity (300K): 0.25 W/m-K; and
Deposited material molecular weight: 200 g/mole.

The y-axis of the plot of FIG. 2 is the relative deviation, i.e., the standard deviation of the flux divided by the mean flux of the deposition profile. For a given Q, the uniformity of the deposition improves initially with increasing values of L/W, and asymptotically approaches a constant value. Thus, increasing L eventually provides no advantage, as there is no significant additional improvement in the uniformity of the organic flux or the deposition.

Figure 3A:
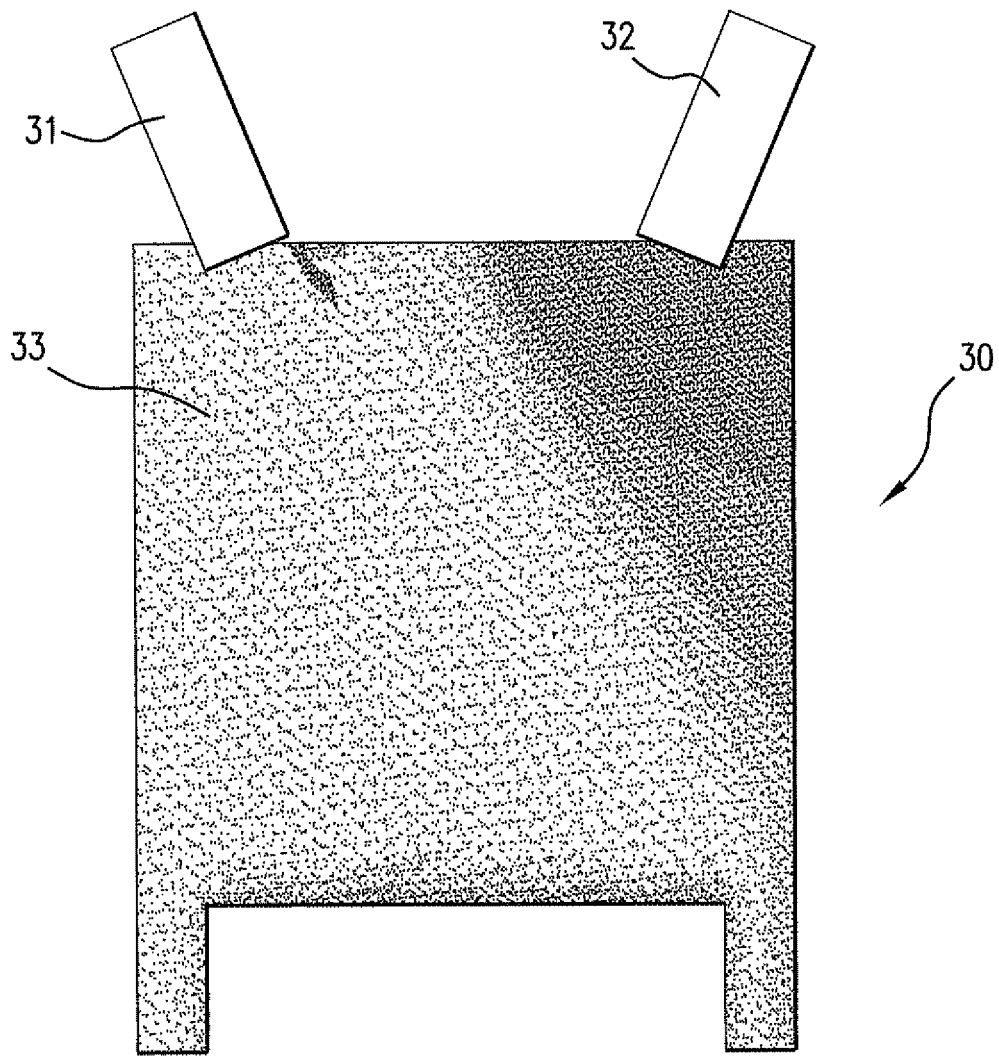
FIGS. 3A and 3B illustrate the flux from two separate source cells having significantly different flow rates.
Figure 3B:
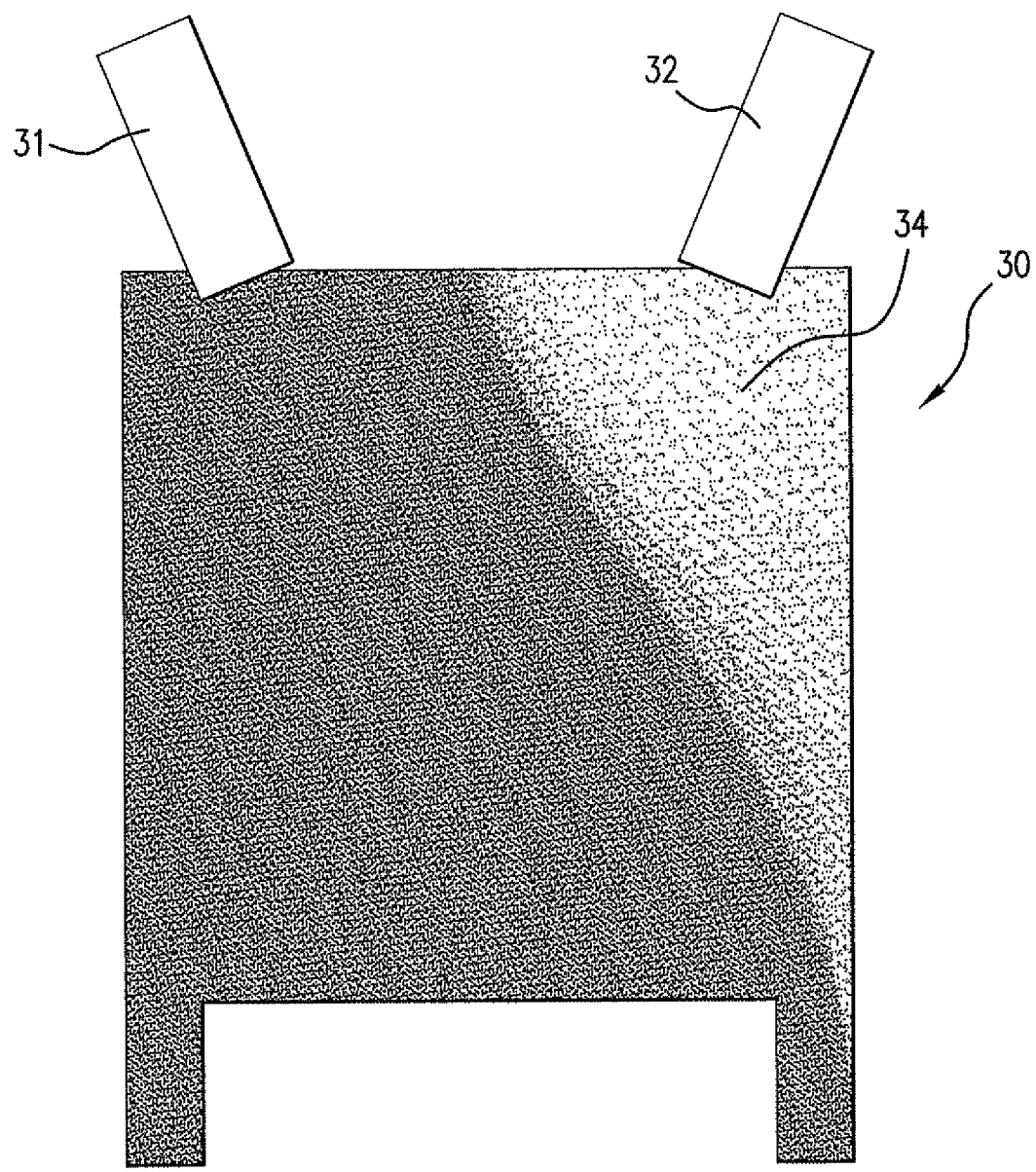
Figure 3C:
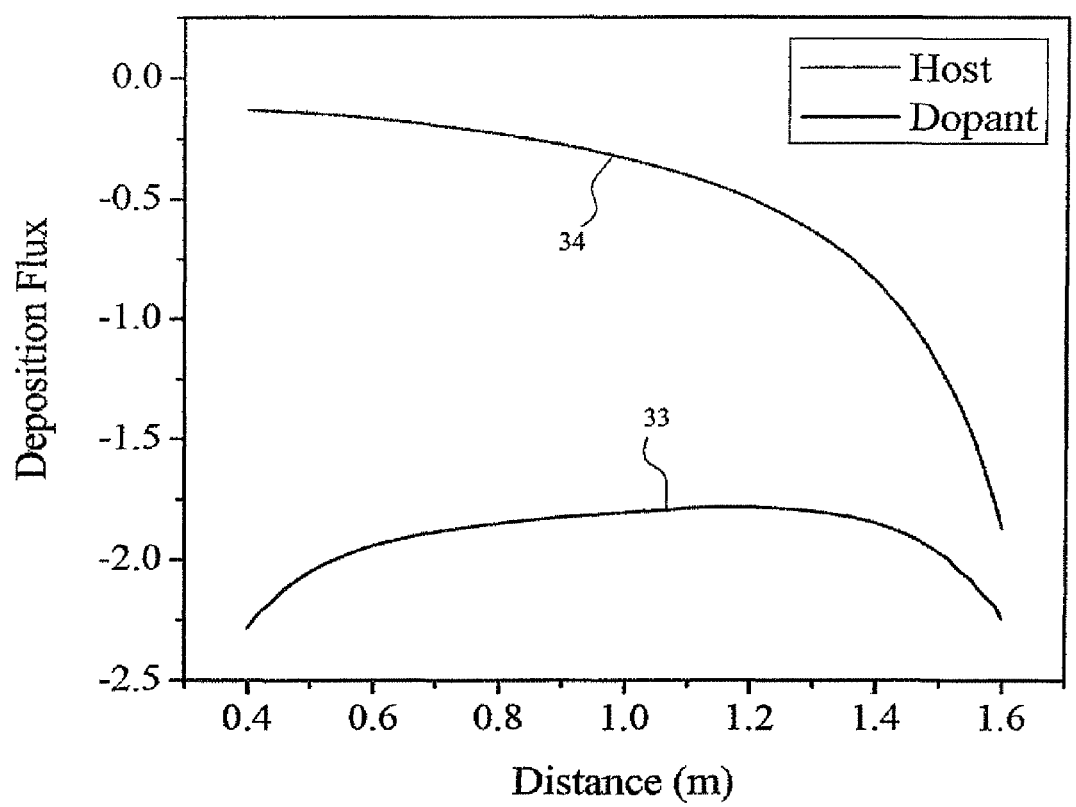
FIG. 3C is a plot of the deposition flux from each source cell against the distance from the source.

The uniformity of the deposition may also deteriorate with increasing source flow rate, requiring a higher L/W for a given uniformity. As illustrated in FIG. 2, the uniformity is significantly better for a Q of 100 sccm than for a Q of 1,000 or 4,000. As will be recognized by those skilled in the art, the uniformity required will depend on the particular application. For the model deposition illustrated in FIG. 2, uniformities preferably have a STD/mean value of less than about 11.5 percent, as illustrated by the upper dashed line in the plot of FIG. 2, and, more preferably, of less than about 8.5 percent, as illustrated in the lower dashed line in the plot of FIG. 2. Therefore, increasing the flow rate, Q, provides a faster deposition rate, but also requires a larger L/W value, and, thus, a larger deposition apparatus. Thus, the L/W of a particular OCVD chamber and the desired uniformity of the flux and resulting film will determine the flow rate, Q, for a given set of deposition conditions. Similarly, for the design of an OCVD chamber, the desired deposition rate, will determine the required Q, and, thus, the L/W of the chamber.

Where a doped material from two separate source cells is deposited on a substrate, uniformity is diminished when the Q of the two sources is significantly different. As will be recognized by those skilled in the art, this arises when a host and at least one dopant are deposited simultaneously. FIG. 3 illustrates the results of a simulation of an OCVD chamber 30 in which a host material and dopant are introduced simultaneously, and the Q of the host material from a first source 31 is 10 times larger than the Q of dopant from a second source 32. As illustrated in FIGS. 3A and 3B, host and dopant materials are introduced into an OCVD chamber 30 from the first source 31 and the second source 32, respectively. FIG. 3A shows the concentration of the host material 33 within the chamber 30, and FIG. 3B shows the concentration of the dopant material 34, where the flow rate, Q, of the host from the first source is 100 sccm, and the Q of the dopant is 10 sccm. Plots of the deposition flux of the host 33, lower plot, and the dopant 34, upper plot, at a given distance from the source are provided in FIG. 3C. As clearly illustrated in FIG. 3, the uniformity of the dopant is significantly worse that that of the host, as the dopant flux 34 is displaced by the host flux 33 within the OCVD chamber 30, as the host flux 33 has a significantly higher flow rate, Q. Thus, to obtain a substantially uniform coating of host and dopant materials, the carrier gases for the host and dopant materials are preferably not introduced from separate sources at significantly different flow rates simultaneously.

Figure 4:
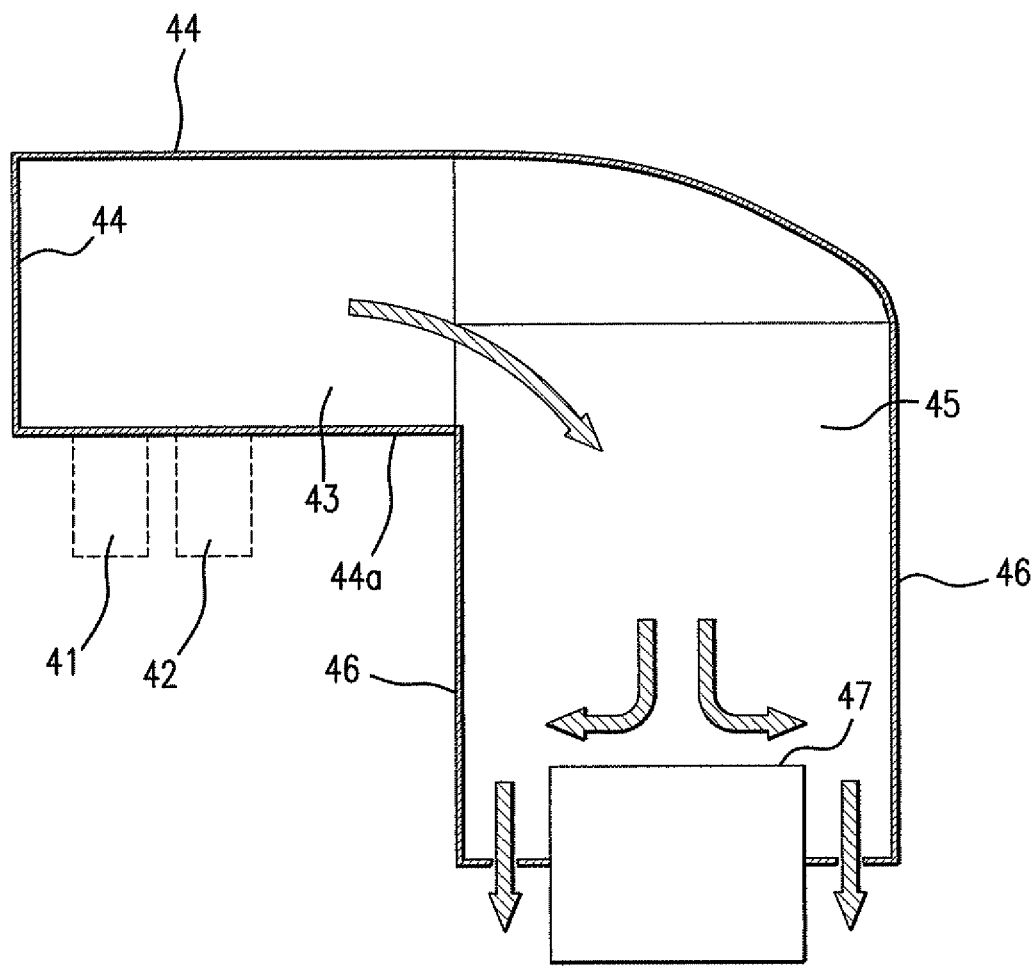
FIG. 4 illustrates an OCVD chamber, having a mixing chamber.

Substantially uniform fluxes and coatings of doped host materials may be obtained by premixing the host and dopant materials before the organic vapors and carrier gases are introduced into the OCVD chamber, or by "stacking" the host and dopant sources. An OCVD apparatus in which host and dopant are premixed with carrier gas is illustrated in FIG. 4. As illustrated, in FIG. 4, the host and dopant are introduced with a carrier gas from source cells 41 and 42, respectively, into a mixing chamber 43. The walls 44, including source plate 44a, of the mixing chamber are preferably heated to prevent condensation of the organic host and dopant materials on the walls 44. The temperature of the walls 44 should be at a temperature higher than the lower of the condensation temperatures of the host and dopant. The mixture of carrier gas, dopant, and host materials is then introduced into the deposition chamber 45, having heated walls 46, such that a substantially uniform organic flux is formed for deposition of a substantially doped film on the cooled substrate 47.

Figure 5:
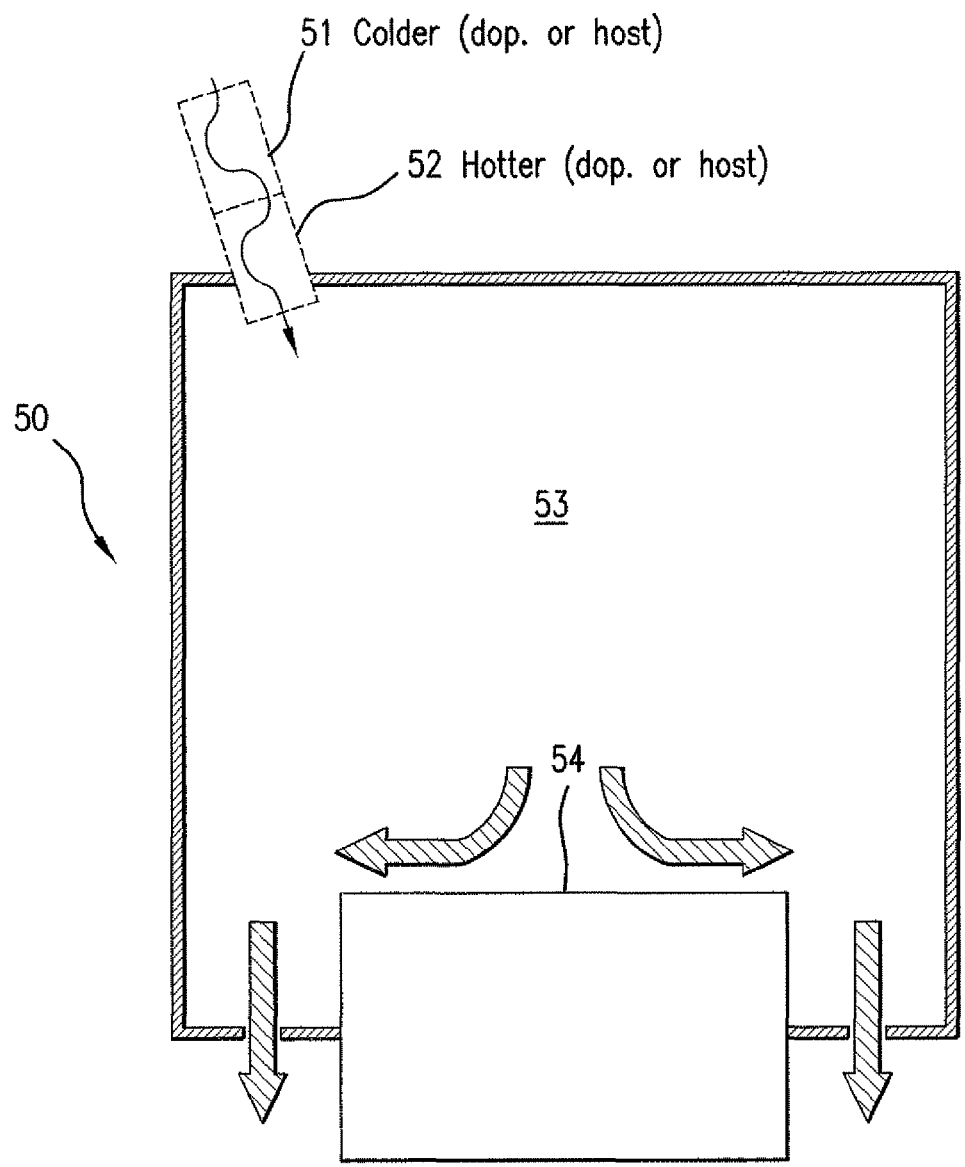
FIG. 5 illustrates an OCVD chamber, having stacked source cells.

FIG. 5 illustrates a "stacked" apparatus 50 in which the source cells 51 and 52 are placed in series. Carrier gas is introduced first into the source cell 51, which contains the organic material, either host or dopant, having the lower sublimation temperature. The resulting mixture of carrier gas and organic vapor is then introduced into source cell 52, which contains the organic material, either host or dopant, having the higher sublimation temperature. The mixture of carrier gas, host vapor, and dopant vapor is then introduced into the heated deposition chamber 53, forming a substantially uniform organic flux that is deposited on the cooled substrate 54.

The conditions within an OCVD chamber have been modeled for different apparatus configurations, source flow rates, Q, and pressures. Modeled configurations include centered source cells, having an axis normal to the surface of the cooled substrate, off-center source cells, having an axis normal to the surface of the cooled substrate, angled, off-center source cells, and OCVD chambers, having heated and unheated source plates. The modeled system was highly coupled and highly non-linear. Model simulations were obtained by solving the two-dimensional continuum equations for energy (temperature), mass (concentration and surface flux), and Navier-Stokes momentum (velocity). Dependent variables of the equations were the velocity field, U, the pressure, P, the temperature, T, and the concentration or flux, C. The modeled systems followed pseudo-compressible dynamics in which the variable dependencies were as follows:

$\mu$(viscosity)=$f(T)$;

$k$(thermal conductivity)=$f(T)$;

$\rho$(density)=$f(T,P)$;

$D$(diffusivity)=$f(T,P)$; and $U$(vector velocity)=$f(\mu,\rho,T,P)$.

The governing equations for the modeling were as follows:
The equation for the mass balance of the organic material is $\nabla \cdot (-D_i \nabla C_i + C_i U) = 0$;

The equation for the energy balance of the nitrogen carrier gas is $\nabla \cdot (-k \nabla T + \rho C p T U) = Q$;

The equation for the momentum balance, i.e., Navier-Stokes, is $-\nabla \cdot \mu (\nabla U + (\nabla U)^T) + \rho (U \cdot \nabla) U + \nabla P = F$; and The continuity equation is $\nabla \cdot U = 0$.

The model was constructed and solved numerically using Femlab®, available from COMSOL of Burlington, Mass. Femlab® is a multiphysics modeling and analysis software package that automates methods of parametric analysis and design optimization. Femlab® was used to model a 2 meter wide by 1.8 meter chamber with a 1.6 meter wide substrate. The boundary conditions for the model, i.e., the conditions at each surface within the OCVD chamber, were based on the assumptions that the temperature of the substrate sufficiently low for the concentration of organic molecules directly above the substrate to be approximated as zero, and that there is no slip at the boundaries, i.e., $U_{x,y}=0$. That is, there was no net velocity at the boundary, such that the material does not penetrate the surface or move along the surface. The boundary conditions for the simulation were as follows: For the surface of the cooled substrate, $U_{x,y}=0$ (no slip), $T=T_{00}$, and $C=0$; for the side walls, $U_{x,y}=0$, $T=T_0$, and the wall was totally insulating; for the source plate, $U_{x,y}=0$, $T=T_0$ or $T_{00}$, depending on the modeled configuration, and the source plate was totally insulating; and, for the output of the source cells, $U=U_0 \rightarrow Q$, $T=T_0$, and the flux=$U_0 * C_0$. The modeling parameters used were as follows:

Flow rate: 25, 100, 2000, 4000, and 10,000 sccm;
Carrier gas: Nitrogen;
Pressure: 1.33 Pa ($1 \times 10^{-2}$ torr) and 133 Pa (1 torr);
Heat capacity: 1000 J/kg-K;
Substrate temperature: 300K (27° C.);
Wall temperature: 650K (377° C.);
Viscosity (300K): $1.73 \times 10^{-5}$ kg/m-s;
Density: P/(RT) kg/m$^3$;
Thermal conductivity (300K): 0.25 W/m-K; and
Deposited material molecular weight: 200 g/mole.

Figure 6:
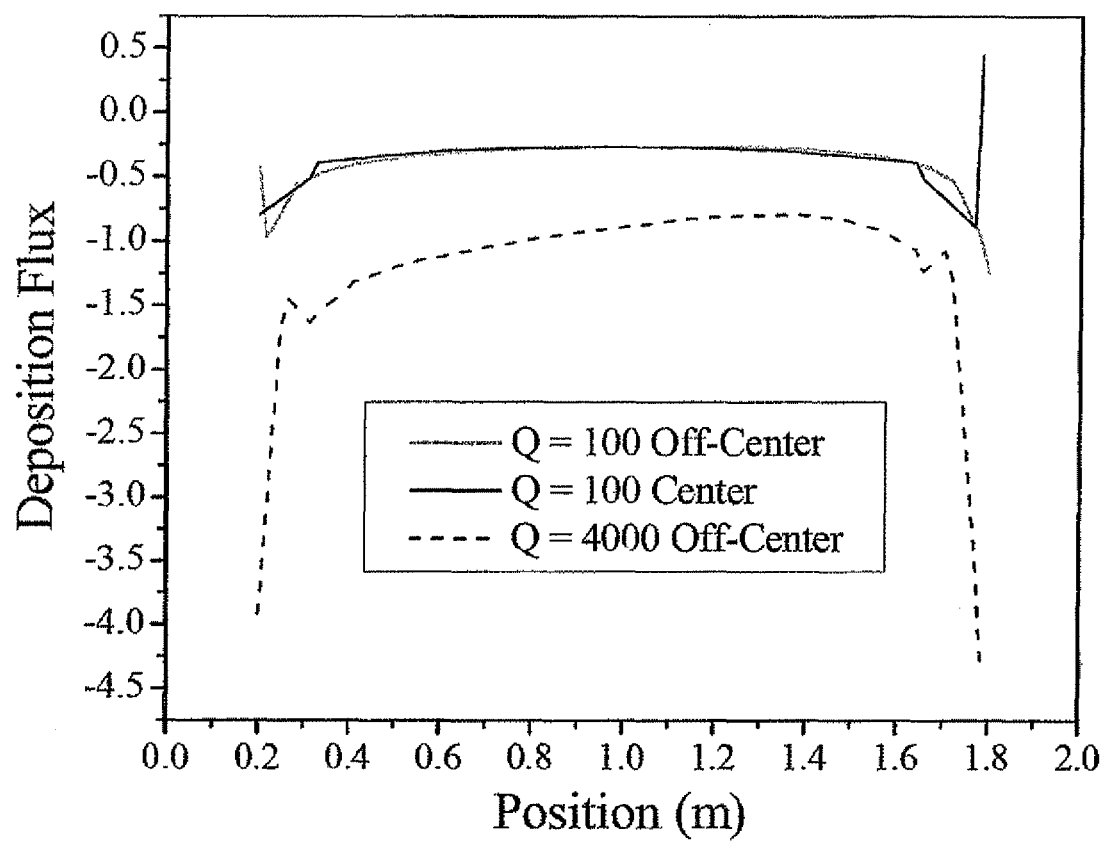
FIG. 6 is a plot of the deposition flux against distance for centered and off-center source cells.
Figure 7:
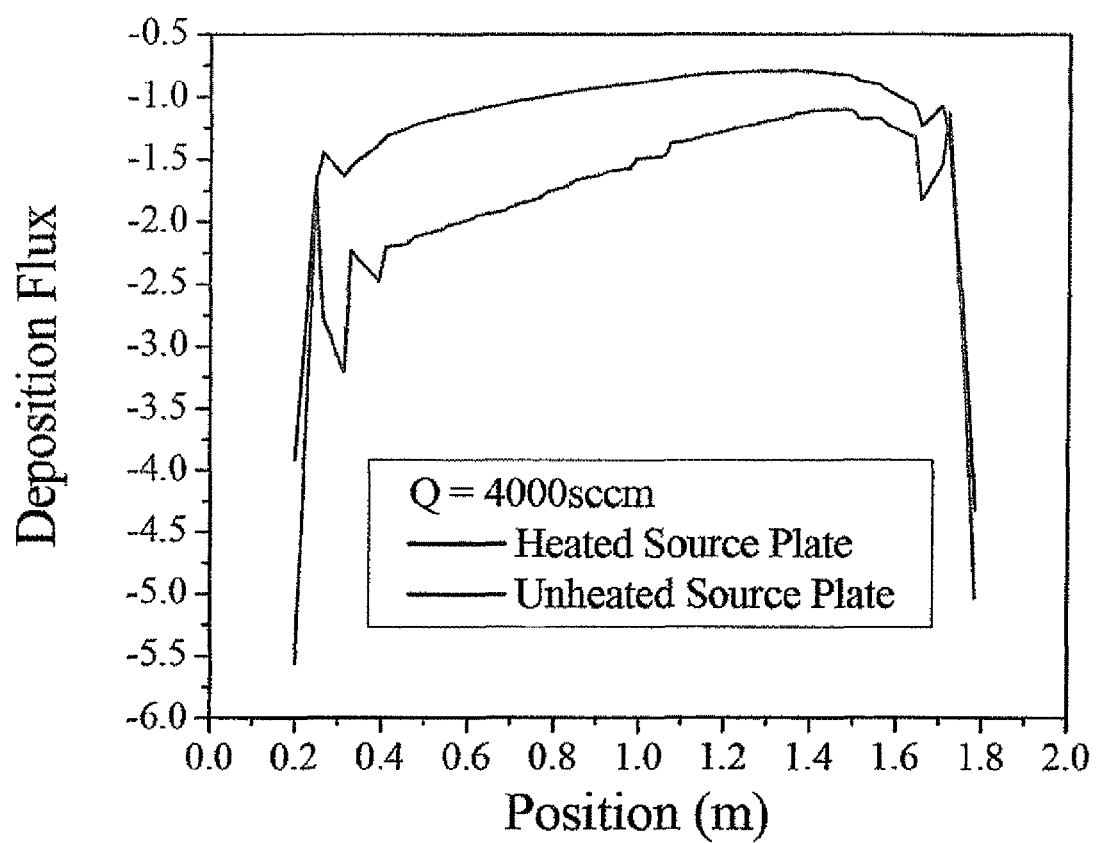
FIG. 7 is a plot of the deposition flux against distance for OCVD chambers having heated and unheated source plates.
Figure 8:
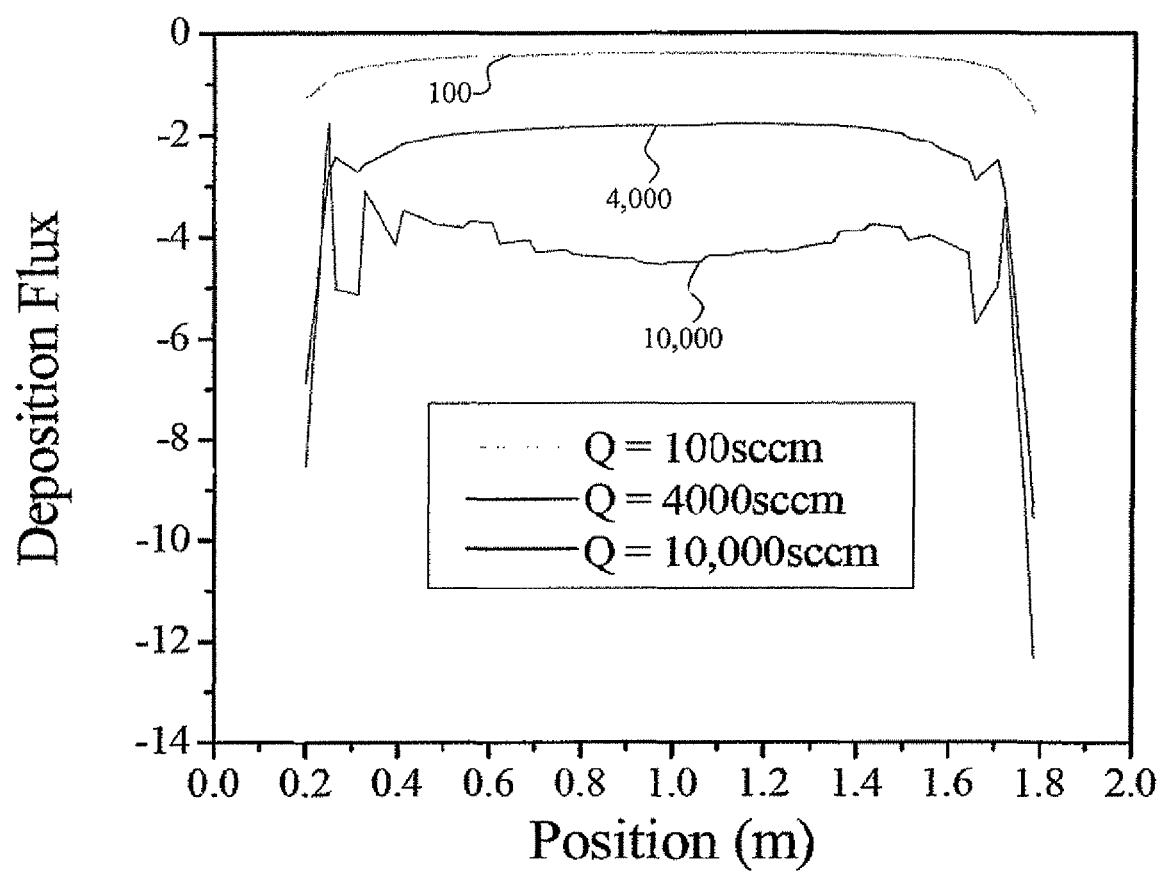
FIG. 8 is a plot of the deposition flux against distance for an off-center directed source cell at three different flow rates.
Figure 9:
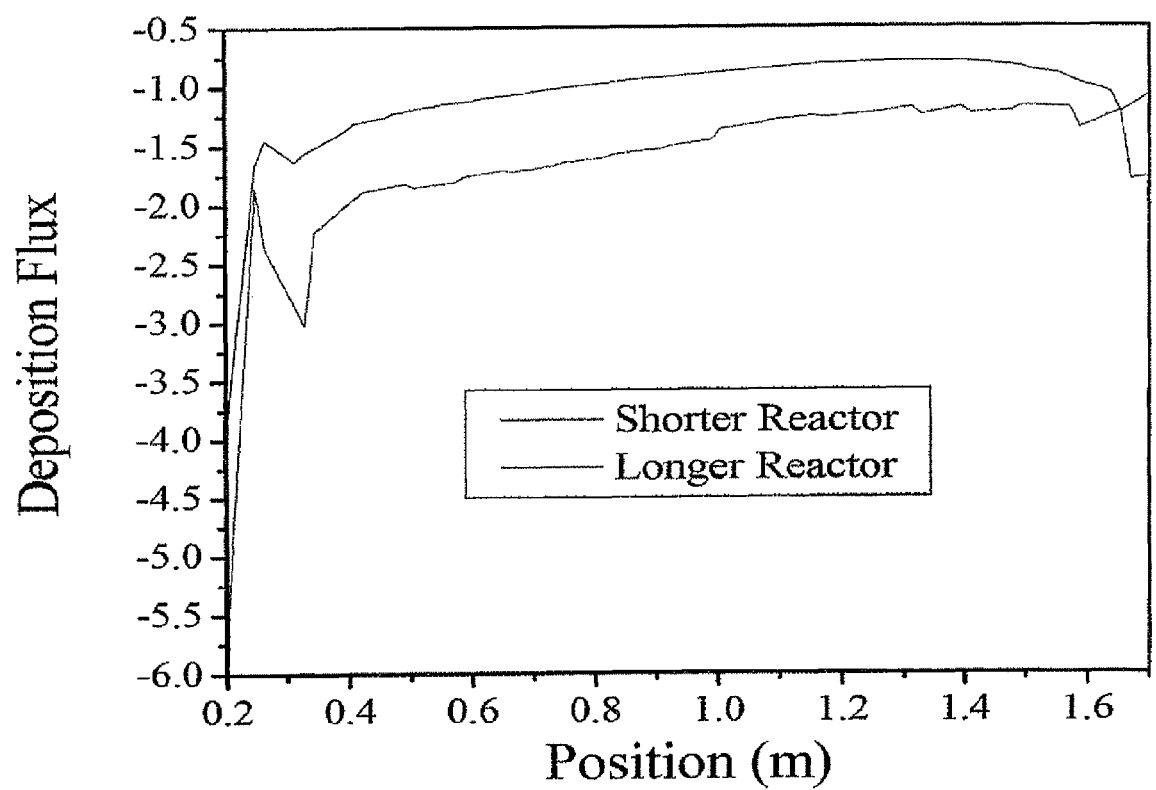
FIG. 9 is a plot of the deposition flux against distance for two different reactors having different source to substrate distances.

The simulations indicate that a centered source cell provides a substantially uniform flux within the OCVD chamber and a symmetric, undistorted boundary layer near the cooled substrate. In contrast, an off-center source cell results in a distorted boundary layer that provides a non-uniform deposition. As illustrated in FIG. 6, at low source flow rates, the deposition profile is substantially independent of source cell location. However, at higher flow rates, film uniformity is significantly worse for an off-center source. This effect is intensified where the source plate is not heated (lower plot), as illustrated in FIG. 7, but may be minimized by pointing source towards substrate center, as illustrated in FIG. 8 for three different Q values. The top plot of FIG. 8 corresponds to a Q of 100 scam, the middle plot corresponds to a Q of 4,000 scam, and the lowest plot corresponds to a Q of 10,000 sccm. As illustrated in FIG. 9, increasing the source to substrate distance does not completely correct for the distorted boundary layer that results form an off-center source cell that is not direct at the center of the substrate. The boundary layer near the surface of the cooled substrate remains distorted, resulting in a loss of uniformity. The deposition flux for the longer reactor is the lower plot in FIG. 9. As seen in FIG. 9, the gains obtained by increasing L/W diminish after a point. The higher noise for the longer reactor in FIG. 9 is the result of the simulation mesh, which spreads out due to the larger simulation area.

Figure 10:
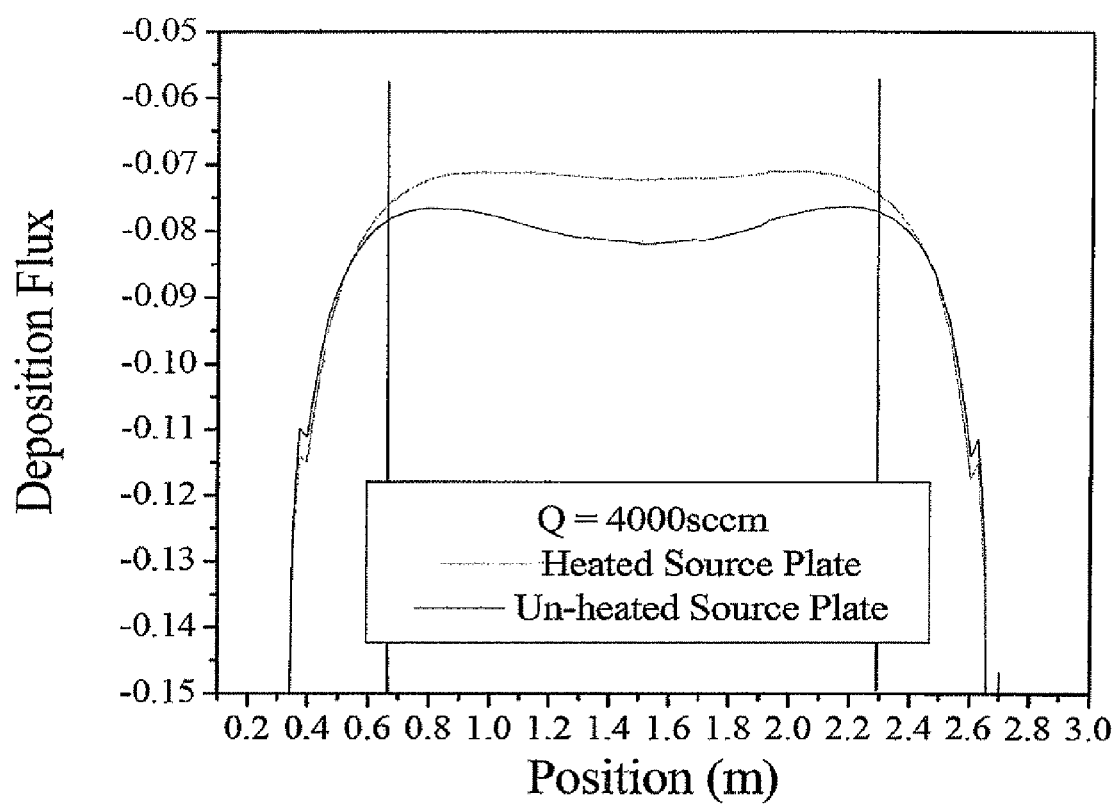
FIG. 10 is a plot of the deposition flux against distance for two different reactors having heated and unheated source plates.

FIG. 10 illustrates the results for the simulated scaling of OCVD chambers, having heated (upper curve) and unheated (lower curve) source plates and a centered source cell. The modeled OCVD chamber had a width of 3 meters and a source to substrate distance of 2.5 meters for a substrate having a width of about 2.5 meters. The source flow rate, Q, was 4,000 scam, and the chamber pressure was 1.33 Pa. The simulated chamber, having the heated source plate provided a substantially uniform deposition profile, substantially the same as the smaller chamber. Again, the heated the source plate provided a significantly better uniformity than the unheated plate. The variation in the uniformity of the deposition with the heated back plate was 3 percent, compared with 7 percent for deposition with the unheated back plate.

The simulations indicate that a chamber L/W of 0.75 provides excellent deposition uniformity, particularly for substrates having a size about 0.6 that of the chamber width. Directed off-centered sources can be used where multiple sources are required. The best uniformity and material usage is obtained using a heated source plate.

The present invention also provides a source cell of an OCVD system, having a plug valve for the control of the flow of vapor and/or gas through the barrel of the source cell into the deposition chamber. Typically, the source cell is heated to a temperature greater than the sublimation temperature of a source of organic material placed in the source cell to provide an organic vapor. Preferably, the flow is controlled with a stopper positioned within the barrel.

Figure 11:
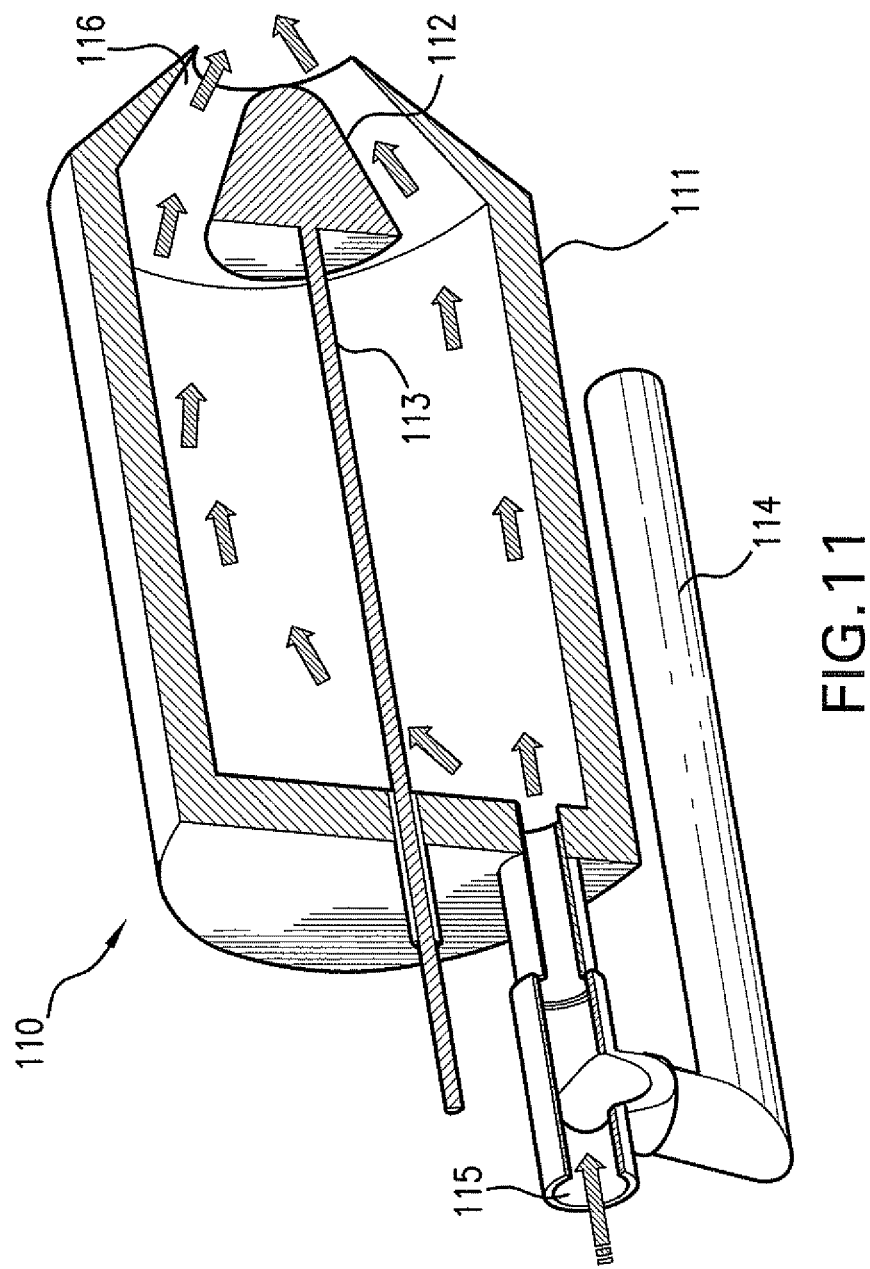
FIG. 11 illustrates a source cell, having a plug valve in the open position.
Figure 12:
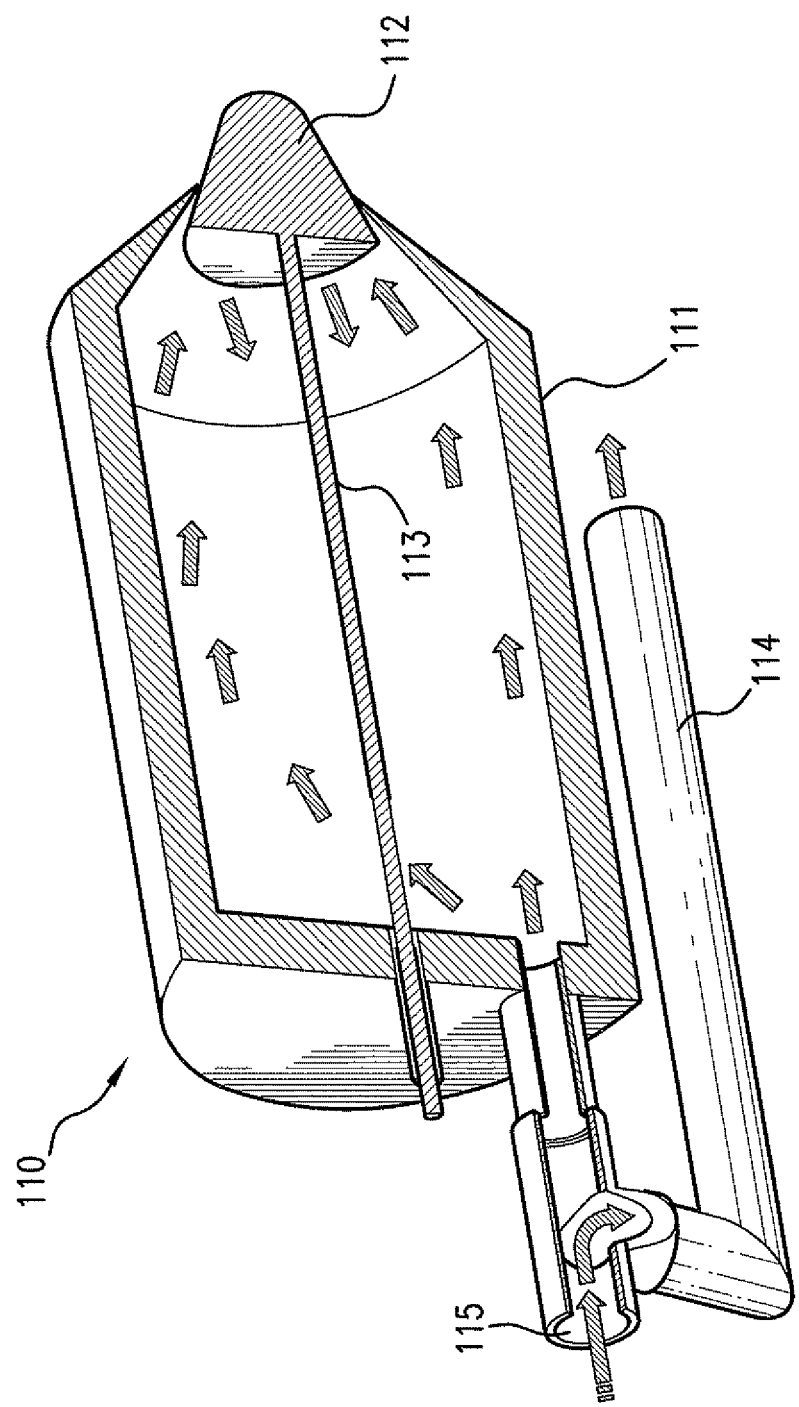
FIG. 12 illustrates a source cell, having a plug valve in the closed position.

Source cells comprising the stopper of the invention in the open and closed positions are illustrated in FIGS. 11 and 12, respectively. As illustrated in FIGS. 11 and 12, a preferred source cell 110 comprises a barrel body or shell 111, a stopper head 112, an actuator rod 113, a gas inlet 115, and a gas outlet 116. Preferably, the source cell further comprises a bypass line 114 that is open when the stopper head is in the closed position, and closed when the stopper head 112 is in the open position. This prevents a pressure build-up or back flow within the source cell 110 when the stopper 112 is in the closed position. When the stopper head 112 is in an intermediate position, such that the gas flow is not cut off completely, but is restricted, the bypass line 114 is also preferably partially closed to maintain the pressure with in the source cell 110. Preferably, the temperature of the source cell 110 at or near the gas outlet 116 is substantially the same as the temperature within the source zone of the OCVD chamber, and the temperature of the source cell 110 at or near the gas inlet 115 is substantially room temperature. The temperature of the source cell 110 is thus hot at the location of the valve, where such elevated temperature may be required. In this manner, a hot valve is provided at the point of use, i.e., at the gas entrance to the chamber.

Although the inlet to the barrel body 111 of FIGS. 11 and 12 is offset, it should be appreciated that, according to other examples, the inlet is not offset. For example, the inlet may be concentric with the longitudinal axis of the barrel body 111. Moreover, it should be appreciated that while the barrel body 111 of FIGS. 11 and 12 has a single gas inlet, the barrel body of other examples may have multiple inlets.

Movement of the stopper head 112 may be manual or automated, and may be achieved by any means known in the art. Preferably, an actuator mechanism (not shown) is attached to the actuator rod 113, and is configured to move the actuator rod 113 and head 112. The actuator mechanism may be of any useful type known in the art. Examples of automated actuator mechanisms include, but are not limited to, pneumatic, hydraulic, and electronic. Electronic mechanisms include stepper motors that can be digitally controlled, allowing precise control of the stopper head 112 position.

Preferably, the stopper head 112 and the gas outlet 116 have corresponding or compatible shapes. Thus, when the stopper is positioned in the closed position, the stopper head 112 seals the gas outlet 116. The contact seal between the stopper head 112 and the barrel body 111 is sufficient to cut off the flow of gas through the outlet 116.

The shape of the stopper head may be, but need not be, the same as the gas outlet 116. The stopper head may be, e.g., conical, frustoconical, or spherical. All that is required is that that portion of the stopper head 112 that contacts the barrel 111 has a shape that will seal the outlet along a continuous line of contact, and prevent any gas flow through the gas outlet 116.

Preferably, the shape of the stopper head 112 and the outlet 116 provide for the self-centering of the stopper head 112 within outlet 116. Thus, the interior wall 117 of the body need not be conical, as illustrated in FIGS. 11 and 12. Any shape that will allow at least a portion of the stopper head 112 to enter and form an intimate seal with the edge of the outlet 116, cutting off the gas flow, is useful in the invention. For example, as illustrated in FIGS. 11 and 12, a portion of the stopper head 112 is conical and the outlet 116 is circular in shape. As the stopper head 112 is directed into the outlet 116, the cone shape of the stopper will guide the stopper into the outlet, naturally resulting in a self-centered alignment. Stopper 112 shapes include, but are not limited to, generally spherical, hemispherical, and conical shapes. The edge of the gas outlet 116 may beveled to match the shape of the stopper head 112. In contrast to typical needle-type valves, e.g., multiple-turn needle valves, that have large contact areas at the sealing seat, the contact area between the stopper head 112 and the outlet 116 is relatively small. This may be advantageous, as temperature changes and associated thermal expansion of the materials may be less likely to cause the stopper head to jam within the outlet 116, thus resulting in a more reliable valve. Moreover, it may be advantageous to position the stopper head 112 in an open position, as shown, e.g., in FIG. 11, when the temperature of the source cell 110 is adjusted, as this may further limit the possibility of jamming due to thermal expansion. In this regard, the materials may have different coefficients of thermal expansion.

The stopper head 112, actuator rod 113, and source cell 111 can be made from any useful material known in the art that can withstand the temperature and pressure conditions to which the barrel 110 is subjected, and can provide a seal between the head 112 and outlet 116. Useful materials include, but are not limited to, metal, such as aluminum, titanium, and stainless steel, glass, quartz, ceramics and composites. Forming the stopper head 112 and the sealing surface of the outlet 116 of the source cell 111 from different materials may be desirable, as this may reduce galling and/or binding at the sealing seat. As a particularly advantageous arrangement, a quartz stopper may form a sealing seat with a stainless steel portion of the source cell.

Source cells in accordance with the invention may be subjected to temperatures of from about 0° to about 500° C.

Barrels in accordance with the invention will often be exposed to a temperature gradient from the inlet end of the barrel to the outlet end. This allows the end of the actuator rod 113 attached to the actuator mechanism to be at room temperature, while the output end is at the operating temperature of the deposition chamber.

This type of valve is highly suitable for high temperature chambers with a temperature gradient along the flow direction. The stopper head of the valve can withstand a high temperature environment while the other end of the actuator rod is kept cool. Sealing of the chamber relies on the seal between the actuator rod and the chamber, shown at the inlet end of the source cell as illustrated in FIGS. 11 and 12, which can be at room temperature to reduce chance of failure. The motion of the push-rod together with the head may be easily controlled by a mechanism outside the chamber at room temperature. By disposing the high-temperature stopper away from the actuators, the reliability of the valve may be largely improved when working in high temperature applications. Because the temperature of the stopper head and the wall opening are at about the same temperature, this valve design may also minimizes the chance of the stopper becoming stuck during motion caused by different thermal expansions between the moving and static parts.

The flow rate of gas through the barrel is a function of the pressure outside the inlet 115 and the outlet 116, the size of the inlet and outlet, and the position of the stopper head 112 relative to the outlet 116. When the stopper head 112 is positioned near or partially within the outlet 116, gas flow through the source cell 110 and outlet 116 will be restricted. Positioning the stopper head 112 away from the outlet 116 a sufficient distance will allow the maximum flow possible for the barrel 110 for the gas pressures at the inlet 115 and outlet 116.

Preferably, organic materials for deposition within the deposition chamber are placed in the heated end of the barrel. Carrier gas can then be introduced through the inlet 115, mixed with organic vapor from the heated organic material, and introduced into the deposition chamber through the outlet 116. Sealing the outlet 116 of the barrel 110 with the stopper head 112 provides for the rapid switching of organic materials within a barrel.

The valve region of the source cell 110 may be heated by the back plate of an OCVD chamber or a separate heating element.

The source cell 110 may also be used to introduce a non-processing gas for balancing pressure or for dilution at a controlled rate. With the source cell of the invention, the flow rate need not be controlled by varying the source pressure of the gas. Instead, the flow rate can be controlled by precise positioning of the stopper head.

Figure 13:
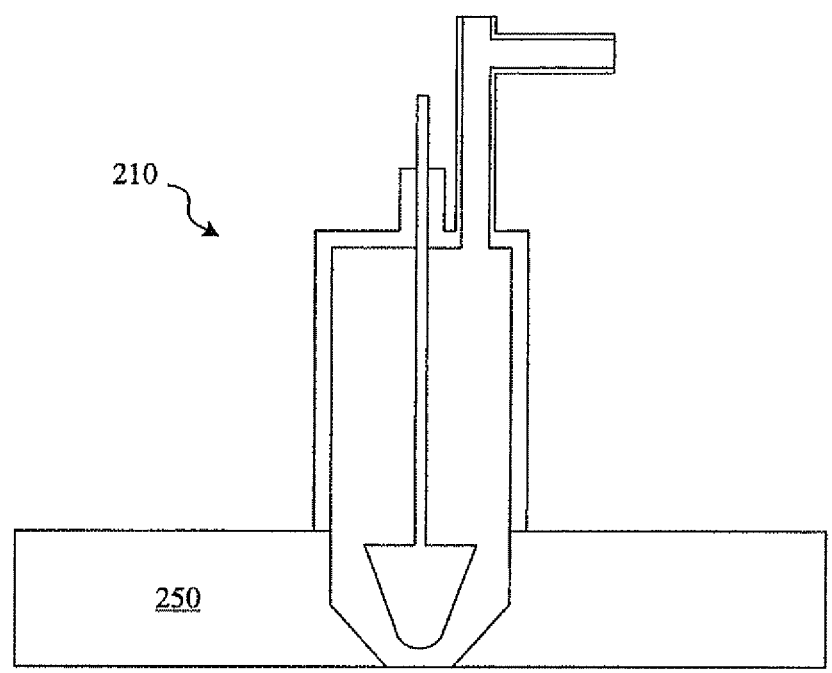
FIG. 13 illustrates a source cell formed in a block.

Referring to FIG. 13, a source cell 210 is positioned in a heated block 250. The block 250 may be, e.g., a ceramic block. The heated block 250 acts as a heat source for the source cell 210 at the outlet, or valve region, thereof. The heated block 250 may be, e.g., a back plate of an OCVD chamber. In this example, the source cell is formed directly into the source block. Because the heat source is located adjacent the valve region of the source cell, the opposite, or inlet region may be maintained at a substantially lower temperature, e.g., at or close to room temperature.

Figure 14:
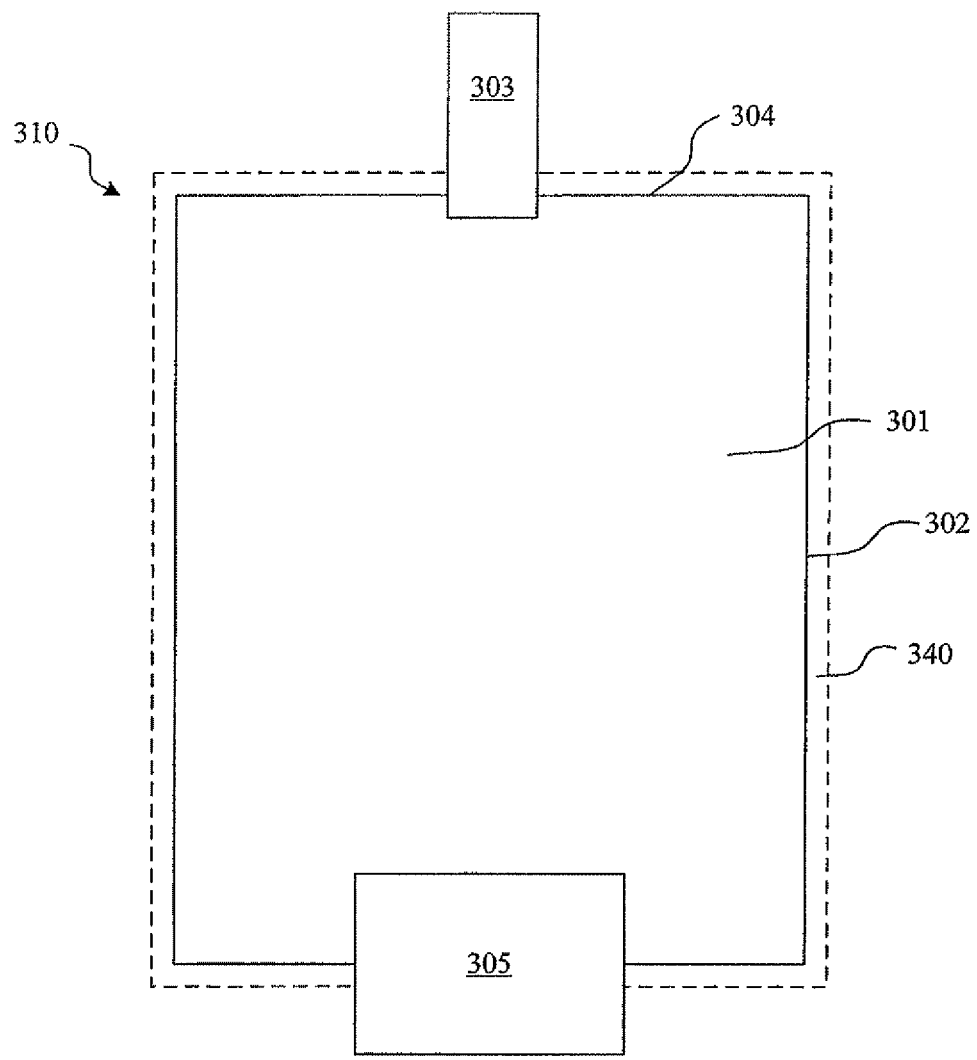
FIG. 14 illustrates an organic continuum vapor deposition (OVCD) chamber of the invention.

An OCVD chamber and substrate are illustrated in FIG. 14. The OCVD chamber 310 comprises a chamber 301, having heated side walls or surfaces 302, a source cell 303, positioned through a heated back plate 304, such that the carrier gas and organic vapor are introduced into the chamber 301. A cooled substrate 305, having a surface to be coated, is placed within the chamber 301. The side walls 302 and the back plate 304 are heated by a heater 340. In this example, the back plate or wall 304, the side walls 302, and the front wall are all heated by the heater 340, which supplies heat through all of the walls. It should be appreciated that the heater may contain multiple and/or separate heating elements. The heating elements may be of any appropriate type, e.g., electric heating elements. The heating element may be, e.g., located within each wall or be located at an outer surface of each wall.

Figures 15A, 15B:
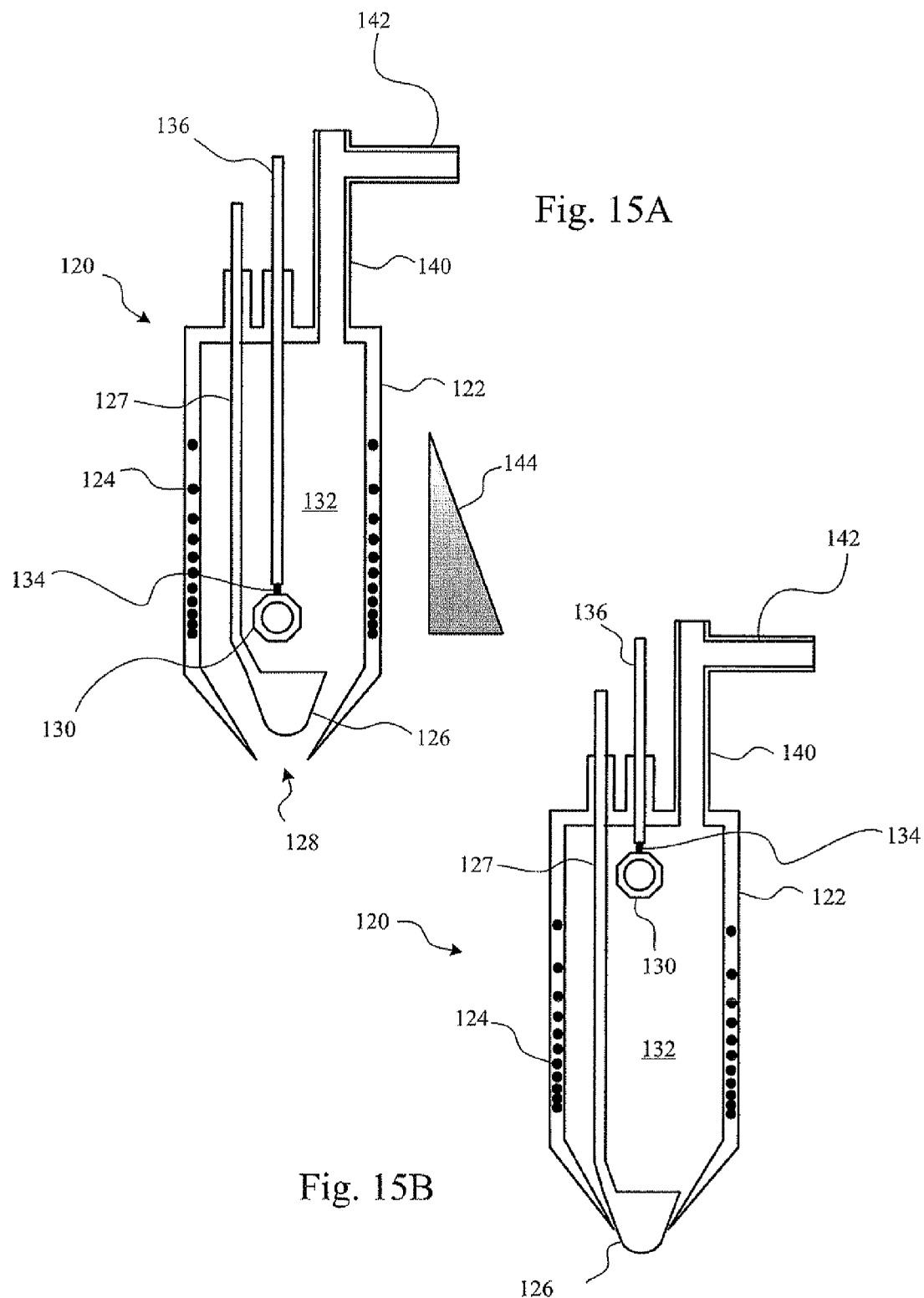
FIGS. 15A and 15B illustrate a source cell having a moveable holder for holding an organic material.

FIGS. 15A and 15B show cross-section side views of an example embodiment of a source cell. Source cell 120 includes a barrel body 122 having at its proximal end, a gas inlet 140, and at its distal end, a gas outlet 128. A carrier gas flows into source cell 120 from gas inlet 140 and flows out through gas outlet 128. Gas inlet 140 also has a bypass line 142 to prevent pressure build-up or back flow within source cell 120. A stopper head 126 is shaped to fit into and seal gas outlet 128. Stopper head 126 is moved back and forth by actuator rod 127 to open and close gas outlet 128. Movement of stopper head 126 may be manual or automated (e.g., by a motorized actuator mechanism).

Source cell 120 is configured to provide a temperature gradient 144 within the chamber 132 of barrel body 122. Temperature gradient 144 rises from a proximal location within chamber 132 to a distal location within chamber 132. Temperature gradient 144 can begin and end anywhere along the length of barrel body 122 and can be established using any suitable heating source, including those described above. For example, temperature gradient 144 is provided by a heating coil 124 within the wall of barrel body 122, with the coils increasing in density as it approaches gas outlet 128.

Source cell 120 also has a holder 130 located within chamber 132 of barrel body 122 for holding the organic source material. Holder 130 moves back and forth along a path from a proximal location to a distal location in chamber 132. Holder 130 is connected to an actuator rod 136 that moves holder 130 back and forth along the central longitudinal axis of barrel body 122. Holder 130 also has a temperature sensor 134, e.g., a thermocouple, for sensing the temperature inside barrel body 122 in the vicinity of holder 130.

In operation, with a rising temperature gradient 144 established within chamber 132, holder 130 containing the organic source material is moved back and forth within chamber 132 to expose the organic source material to the desired temperature. The position of holder 130 can be adjusted according to the temperature sensed by temperature sensor 134. Thus, the evaporation rate of the organic source material can be rapidly controlled by adjusting the position of holder 130 within temperature gradient 144. By controlling its evaporation rate, the deposition rate of the organic source material can be controlled to allow for improved film morphology.

Also, this configuration allows for the organic source material to be quickly cooled after deposition is complete by withdrawing holder 130 to a cooler temperature. For example, referring to FIG. 15A, during film deposition, stopper head 126 is in an open position and holder 130 is held within temperature gradient 144 to vaporize the organic source material. Referring to FIG. 1B, after film deposition is complete, stopper head 126 is moved to a closed position and holder 130 is retracted to the cooler proximal end of barrel body 122 to prevent thermal degradation of the organic source material.

Materials that can be deposited with the apparatus and methods of the invention include, but are not limited to, CBP: 4,4'-N,N-dicarbazole-biphenyl m-MTDATA 4,4',4"-tris(3-methylphenylphenlyamino)triphenylamine Alq₃: 8-tris-hydroxyquinoline aluminum
Bphen: 4,7-diphenyl-1,10-phenanthroline
n-BPhen: n-doped BPhen (doped with lithium)
C60
F₄-TCNO: tetrafluoro-tetracyano-quinodimethane
p-MTDATA: p-doped m-MTDATA (doped with F₄-TCNQ)
Ir(ppy)₃: tris(2-phenylpyridine)-iridium
Ir(ppz)₃: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: N,N'-diphenyl-N-N'-di(1-naphthyl)-benzidine
TPD: N,N'-diphenyl-N-N'-di(3-toly)-benzidine
BAlq: aluminum(III)bis(2-methyl-8-quinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylenedioxythiophene) with polystyrenesulfonate (PSS)
Pentacene
PTCBI: 3,4,9,10-perylenetetracarboxylic bisbenzimidazole
Ir(4,6-F₂ppy)₂(BPz₄) iridium(III) bis(2-(4,6-difluorphenyl) pyridinato-N,C²)η²-N,N'-(tetrakis(1-pyrazolyl)borate)
p-(SiPh₃)₂Ph p-bis(triphenylsilyl)benzene
DBC dibenzo-18-crown-6
F₃ 2,2':7',2''-Ter-9-dimethyl-fluorene
SC5 2,4,6-triphenyl-1-biphenyl-benzene
P4N 1,2,3,4-tetraphenylnapthalene It should be appreciated that the apparatus and methods described herein may be applied in the deposition of non-organic materials.

While it is apparent that the invention disclosed herein is well calculated to fulfill the objects stated above, it will be appreciated that numerous modifications and embodiments may be devised by those skilled in the art. Therefore, it is intended that the appended claims cover all such modifications and embodiments as falling within the true spirit and scope of the present invention.

What is claimed is:

1. A source cell for use with an organic vapor deposition chamber, but not itself being an organic vapor deposition chamber, the source cell comprising:
    a hollow barrel, having a gas inlet and a gas outlet;
    a heating element in or on the wall of the hollow barrel; and
    a stopper at a first end of an actuator rod, the stopper configured to prevent gas flow through the gas outlet when the stopper is in a closed position within the barrel and to allow gas to flow from the gas outlet when the stopper is in an open position, wherein the stopper has a cross-sectional shape sufficiently similar to the gas outlet shape to seal the gas outlet when the stopper is in the closed position; wherein
    the source cell is configured to heat the gas as the gas passes through the gas outlet, the temperature of the barrel substantially higher at the gas outlet than at the gas inlet.

2. The source cell of claim 1, further comprising a gas bypass line in fluid communication with the gas inlet, wherein the gas bypass line is open when the stopper is in the closed position, and closed when the stopper is in the open position.

3. The source cell of claim 1, wherein the stopper has a shape that self-centers the stopper in the gas output when the stopper is in the closed position.

4. The source cell of claim 1, wherein the hollow barrel is formed in a ceramic block.

5. The source cell of claim 4, wherein the ceramic block is the source plate of the deposition chamber.

6. The source cell of claim 1, wherein the gas outlet is configured to allow the heated gas to flow directly into the deposition chamber.

7. The source cell of claim 1, wherein the heating element is configured to provide a temperature gradient within the hollow barrel, the temperature gradient increasing from a proximal to distal direction in the hollow barrel.

8. The source cell of claim 7, further comprising a holder for holding an organic material, the holder being movable along a path from a proximal point within the hollow barrel to a distal point within the hollow barrel.

9. The source cell of claim 8, wherein the hollow barrel has a longitudinal axis, and wherein the path is parallel to the longitudinal axis of the hollow barrel.

10. The source cell of claim 8, further comprising a temperature sensor that senses the temperature inside the hollow barrel in the vicinity of the holder.

11. The source cell of claim 3, wherein the stopper has a conical, frustroconical, hemispherical, or spherical shape.

12. The source cell of claim 1, wherein the heating element is a heating coil.

13. The source cell of claim 12, wherein the coils increase in density as it approaches the gas outlet to provide a temperature gradient that increases from a proximal to distal direction in the hollow barrel.

14. The source cell of claim 13, further comprising a holder for holding an organic material, the holder being movable along a path from a proximal point within the hollow barrel to a distal point within the hollow barrel.

15. The source cell of claim 14, wherein the hollow barrel has a longitudinal axis, and wherein the path is parallel to the longitudinal axis of the hollow barrel.

* * * * *